(12) United States Patent
Hwang et al.

(10) Patent No.: US 7,427,807 B2
(45) Date of Patent: Sep. 23, 2008

(54) CHIP HEAT DISSIPATION STRUCTURE AND MANUFACTURING METHOD

(75) Inventors: Ming-Hang Hwang, Taipei (TW); Yu-Chiang Cheng, Taipei (TW); Chao-Yi Chen, Taipei (TW); Ping-Feng Lee, Banciao (TW); Hsin-Lung Kuo, Taipei (TW); Bin-Wei Lee, Taipei (TW); Wei-Chung Hsiao, Taipei (TW)

(73) Assignee: Mitac Technology Corp., Hsin-Chu Hsien (TW)

( * ) Notice: Subject to any disclaimer, the term of this patent is extended or adjusted under 35 U.S.C. 154(b) by 136 days.

(21) Appl. No.: 11/356,070

(22) Filed: Feb. 17, 2006

(65) Prior Publication Data
US 2006/0205118 A1 Sep. 14, 2006

(30) Foreign Application Priority Data
Feb. 18, 2005 (TW) .............................. 94104840 A (51) Int. Cl.
*H01L 23/34* (2006.01)
(52) U.S. Cl. ................ 257/720; 257/678; 257/704; 257/E21.17; 257/E21.005; 257/E21.27; 257/E23.109; 257/E23.111
(58) Field of Classification Search ................ 257/720, 257/678, 684, 688, 704, 706, 713, 762, 765, 257/771, 777
See application file for complete search history.

(56) References Cited
U.S. PATENT DOCUMENTS

| | | | |
|---|---|---|---|
| 4,734,339 A | 3/1988 | Schachner et al. | |
| 5,045,972 A | 9/1991 | Supan et al. | |
| 5,070,936 A | 12/1991 | Carroll et al. | |
| 5,366,688 A | 11/1994 | Terpstra et al. | |
| 5,389,400 A | 2/1995 | Ting et al. | |
| 5,552,635 A | 9/1996 | Kim et al. | |
| 5,591,034 A | 1/1997 | Ameen et al. | |
| 5,642,779 A | 7/1997 | Yamamoto et al. | |
| 5,660,318 A | 8/1997 | Jung et al. | |
| 5,737,191 A * | 4/1998 | Horiuchi et al. ............. 361/764 |
| 5,789,809 A * | 8/1998 | Joshi .......................... 257/704 |
| 5,925,413 A | 7/1999 | Holzer et al. | |
| 5,955,781 A * | 9/1999 | Joshi et al. .................. 257/712 |
| 6,055,154 A | 4/2000 | Azar | |

(Continued)

FOREIGN PATENT DOCUMENTS

CN      85104959 A      1/1987

(Continued)

*Primary Examiner*—David Nhu
(74) *Attorney, Agent, or Firm*—Rosenberg, Klein & Lee (57) ABSTRACT

This invention discloses a manufacturing method and a structure for a chip heat dissipation. This heat dissipation structure includes a bottom plate of circuit structure, a die of central processing unit and a cap. The cover is often used in conducting the waste heat generated from the chip. The cover can be made of a special thermal conduction material, including a metal and a bracket structure of carbon element which have high thermal conductivity so as to improve the efficiency of heat conduction. The corresponding manufacturing method for this heat conduction material can be made with chemical vapor deposition, physical vapor deposition, electroplating or the other materials preparation method. The bracket structure of carbon element can be coated on the metal surface and also can be mixed into the metal.

18 Claims, 7 Drawing Sheets

U.S. PATENT DOCUMENTS

| | | |
|---|---|---|
| 6,166,434 A | 12/2000 | Desai et al. |
| 6,255,376 B1 | 7/2001 | Shikata et al. |
| 6,496,373 B1 | 12/2002 | Chung |
| 6,639,757 B2 * | 10/2003 | Morley et al. ............ 360/245.9 |
| 6,844,054 B2 | 1/2005 | Whatley |
| 6,987,318 B2 | 1/2006 | Sung |
| 7,147,367 B2 | 12/2006 | Balian et al. |
| 2002/0023733 A1 | 2/2002 | Hall et al. |
| 2003/0152773 A1 | 8/2003 | Chrysler et al. |
| 2003/0168731 A1 | 9/2003 | Matayabas et al. |
| 2004/0105237 A1 | 6/2004 | Hoover et al. |
| 2004/0183172 A1 | 9/2004 | Saito et al. |

FOREIGN PATENT DOCUMENTS

| | | |
|---|---|---|
| CN | 1014805 B | 11/1991 |
| CN | 1067615 C | 1/1993 |
| CN | 1567131 | 1/2005 |
| EP | 1469513 | 10/2004 |
| JP | 62024647 A | 2/1987 |
| JP | 06330325 A | 11/1994 |
| JP | 2005-005528 | 1/2005 |
| KR | 1020010064620 A | 7/2001 |
| TW | 291592 | 11/1996 |
| TW | 552841 | 9/2003 |
| TW | M248189 | 10/2004 |
| WO | WO2004/080914 A1 | 9/2004 |

* cited by examiner

CHIP HEAT DISSIPATION STRUCTURE AND MANUFACTURING METHOD

FIELD OF THE INVENTION

The present invention relates to a chip heat dissipation structure and a manufacturing method and, more particularly, to the manufacturing method for making a heat conduction material containing a metal and a bracket structure of carbon element.

BACKGROUND OF THE INVENTION

In recent years, the pace of high technology industry development is extremely fast, the development of electronic components is toward small volumes and high densities. The performance requirements for the aforesaid components also increase that generates much waste heat. The efficiency of the electronic components will be decreased if the waste heat is unable to eliminate appropriately. Therefore, various heat conduction materials are provided to improve the efficiency of heat dissipation.

In the prior art, the material applying in the heat dissipation structure usually includes aluminum or copper to be the tendency of current heat dissipation technique. In addition, in the package technique, the Flip Chip Pin Grid Array (FC-PGA) is applied for a replaceable component like central processors and the Flip Chip Ball Grid Array (FC-BGA) is applied for a non-replaceable component like display chips, North Bridge and South Bridge. Flip-chip means that a substrate of a chip is exposed to help the heat dissipation generated from an integrate circuit. In the aforesaid package technique, an integrated heat spreader (IHS) is further adopted to protect core chips effectively, so as to improve the efficiency of heat dissipation.

Figure 1:
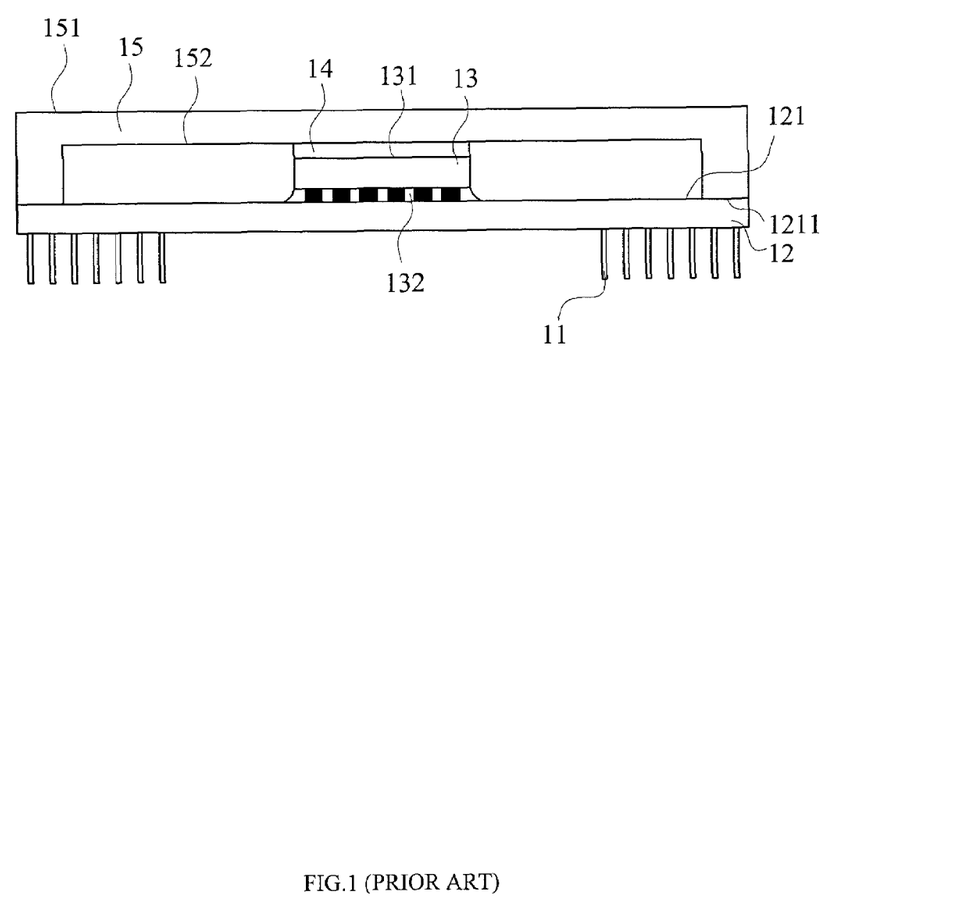
FIG. 1 is a sectional drawing illustrating a conventional package technique for a Flip Chip Pin Grid Array and an Integrated Heat Spreader.

Referring to FIG. 1, a sectional drawing illustrates a package technique for a FC-PGA and an IHS. The package technique comprises a plurality of pins 11, a bottom plate 12, a die 13, a heat contact layer 14 and a cap 15. The bottom plat 12 is a plate with organic materials of circuit structure and is called printed circuit board (PCB). The bottom plate 12 is used to pull an IC of the die 13 to further connect with other control units. An edge 1211 of an upper surface 121 of the bottom plate 12 is for pasting the cap 15. A bottom 132 of the die 13 is a plane of the IC and is electrically connected to the upper surface 121 of the bottom plate 12. A top 131 of the die 13 corresponds to the bottom 132 of the die 13 and the top 131 of the die 13 can be exposed. The top 131 of the die 13 can be connected to a lower plane 152 of the cap through a heat contact layer 14. The cap 15 is made by aluminum alloy or copper and is for protecting a core chip, so as to improve the efficiency of heat dissipation.

However, the heat dissipation material made by copper or aluminum alloy may be unable to satisfy the requirement in eliminating the waste heat generated by the current technology products, and therefore other heat dissipation materials are needed.

Besides, diamonds are well known and have characteristics with the highest hardness, the fastest heat conduction, and the widest refraction range in current materials. Diamonds, therefore, are always one of more important materials in engineering due to the excellent characteristics. The thermal conductivity of diamonds at the normal atmospheric temperature is five times more than copper. Moreover, the thermal expansion factor of diamonds at high temperature is very small that shows the excellent efficiency for heat dissipating. The feature may help people to differentiate the adulteration of diamonds. In the prior art, many technologies and manufacture procedures have been developed to make diamonds. The direct decomposition for hydrocarbons is the most familiar method like Microwave Plasma Enhance Chemical Vapor Deposition (MPCVD) and Hot Filament CVD (HFCVD). By the aforesaid methods, polycrystalline diamond films can be deposited. The characteristic of the polycrystalline diamond films is the same as the single crystal diamonds.

SUMMARY OF THE INVENTION

Briefly, to eliminate the waste heat generated by electronic components efficiently and to face the development tendency of electronic components with small volumes and high densities, the object of the present invention is to provide a heat conduction material which is applied for a cap to improve the efficiency of heat dissipation. Moreover, the heat conduction material provided by the present invention is not only restricted to apply for the chip, but is also applied for other heat conduction appliances.

In accordance with the present invention a heat conduction material comprises a metal and a bracket structure of carbon element. The metal can be copper or aluminum alloy or other metals with high thermal conductivity. In addition, the bracket structure of carbon element is diamonds. The bracket structure of carbon element can be coated on a surface of the metal or can be mixed into the metal. The heat conduction material can be made by chemical vapor deposition (CVD), physical vapor deposition (PVD), melting, electroplating or other material preparations.

Other features and advantages of the present invention and variations thereof will become apparent from the following description, drawings, and claims.

DETAILED DESCRIPTION OF THE PREFERRED EMBODIMENTS

Figure 2:
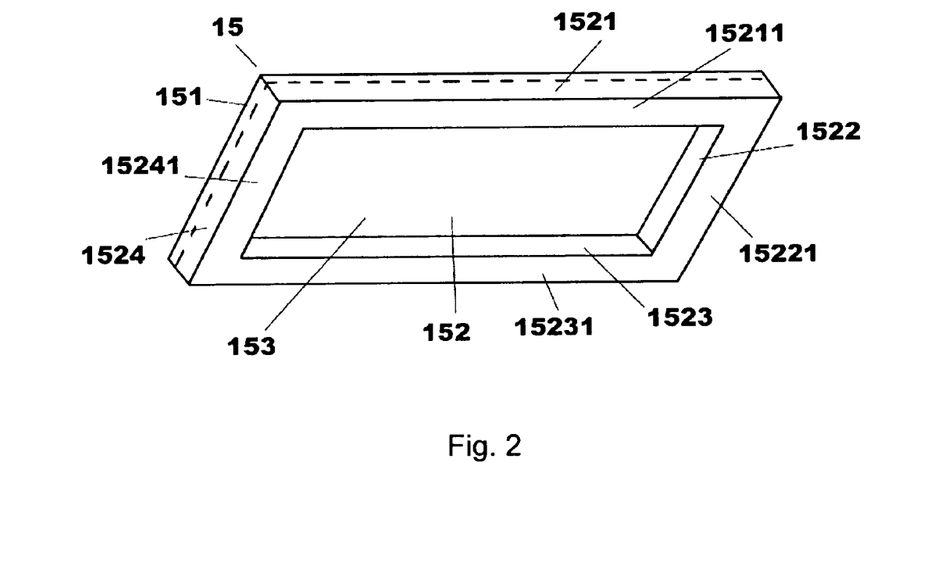
FIG. 2 is a schematic diagram illustrating a conventional package technique for a cap according to FIG. 1.

Referring to FIG. 2, a schematic diagram illustrates the cap 15 according to FIG. 1. The dashed line can distinguish between the lower plane 152 and each side 1521, 1522, 1523 and 1524. The cap 15 comprises an upper plane 151 and the lower plane 152. Four edges of the lower plane 152 of the cap 15 extend downward a side 1521, 1522, 1523 and 1524 respectively. Each side 1521, 1522, 1523, 1524 and the lower plane 152 are formed a space 153 for placing the die 13 as described in FIG. 1. A hemline 15211, 15221, 15231, 15241 extended from each side 1521, 1522, 1523 and 1524 is pasted on the edge 1211 of the upper surface 121 of the bottom plate 12 as shown in FIG. 1. In addition, according to the chip heat dissipation structure, the heat conduction material combining a metal with a bracket structure of carbon element is applied for the cap 15. The heat contact layer 14 can be formed on the lower plane 152 of the cap 15. The heat contact layer 14 is a heat interface material like thermal grease or other electrical insulating materials with high thermal conductivity.

Figure 3:
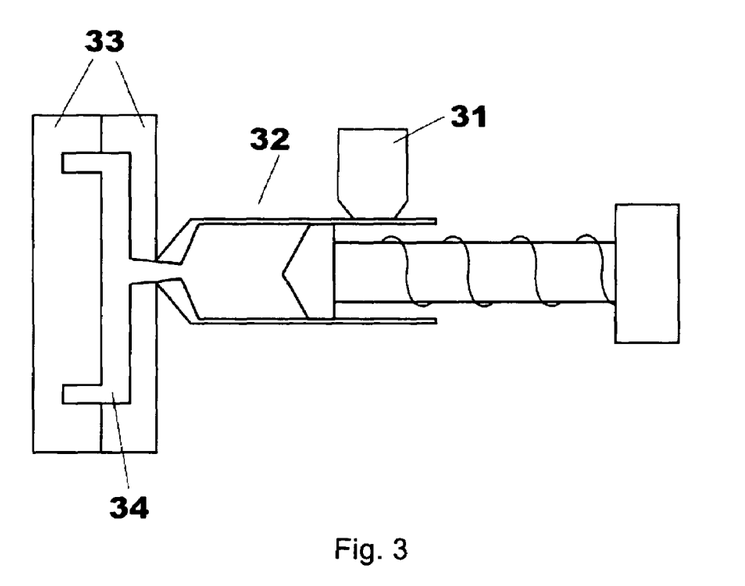
FIG. 3 is a schematic diagram illustrating a die for manufacturing a cap according to an embodiment of the present invention.

At the same time, the cap 15 can be made by using a die as described in FIG. 3. The die comprises a mold material supplier 31, a mold material injector 32 and a mold 33. A mold material is injected by the mold material injector 32 to a cavity 34 of the mold 33 for molding. The mold material is then formed to be the shape of the cap 15 as shown FIG. 2, and the cap 15 has an upper plane 151 and a lower plane 152. Four edges of the lower plane extend downward a side 1521, 1522, 1523 and 1524 respectively. The mold material can be a melt material which combines a metal with a bracket structure of carbon element. The metal is copper or aluminum or silver or other metals with high thermal conductivity or other material combinations. The melting point of the bracket structure of carbon element is higher than any metal of the mentioned above. Therefore, the bracket structure of carbon element can be mixed into those metals.

Figure 4:
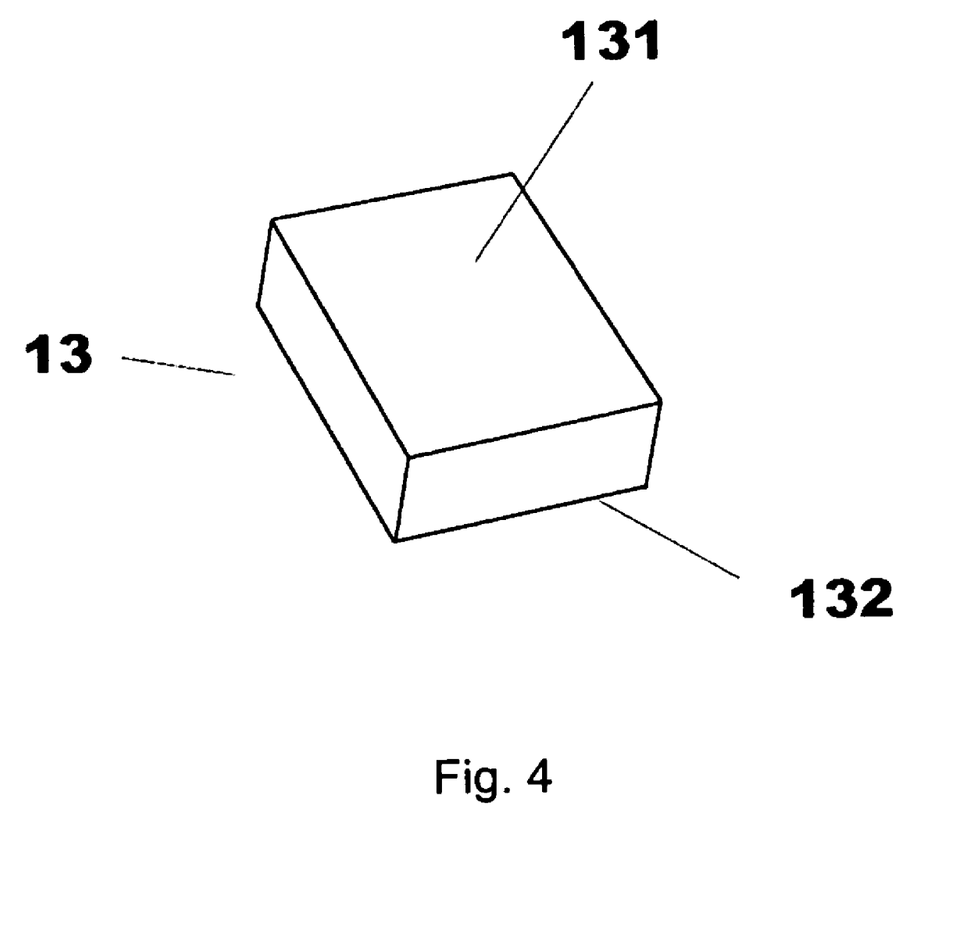
FIG. 4 is a schematic diagram illustrating a conventional package technique for the die according to FIG. 1.

Referring to FIG. 4, a schematic diagram illustrates the package technique for a die 13 according to FIG. 1. A distinguish between the top 131 of the die 13 and the bottom 132 is illustrated. Under the flip-chip package technique, the top 131 is a substrate of the die 13, and the substrate is a silicon substrate. The bottom 123 is a growth of the die 13. The heat contact layer 14 is directly formed on the top 131 of the die 13 for pasting the lower plane 152 of the cap 15. The heat contact layer 14 is a heat interface material like thermal grease or other electrical insulating materials with high thermal conductivity.

Figure 5:
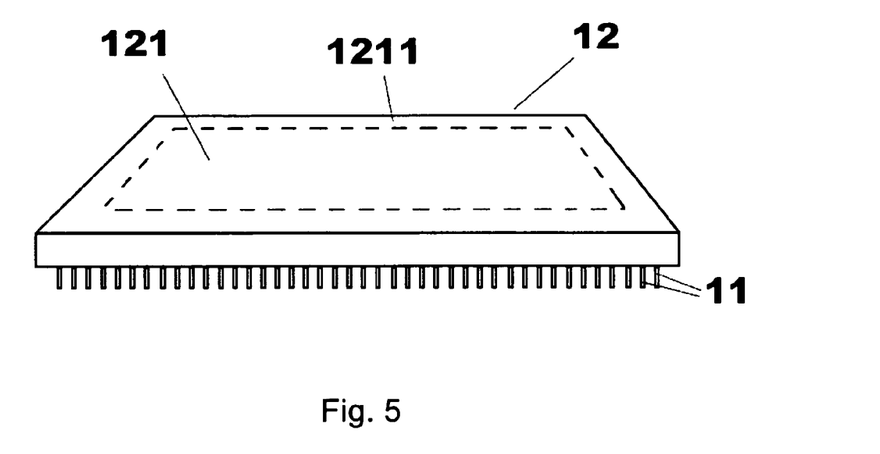
FIG. 5 is a schematic diagram illustrating a conventional package technique for the bottom plate and the pin according to FIG. 1.

Referring to FIG. 5, a schematic diagram illustrates the bottom plate 12 and the pins 11, which are provided by the package technique as shown in FIG. 1. The upper surface 121 of the bottom plate 12 is electrically connected to the bottom 132 of the die 13 as shown in FIG. 4. The dashed line of the upper surface 121 and an outer of the upper surface 121 are formed a scope. The scope is the edge 1211 which is the bottom plate 12 as shown in FIG. 1 pasting the cap 15 as shown in FIG. 2.

Figure 6:
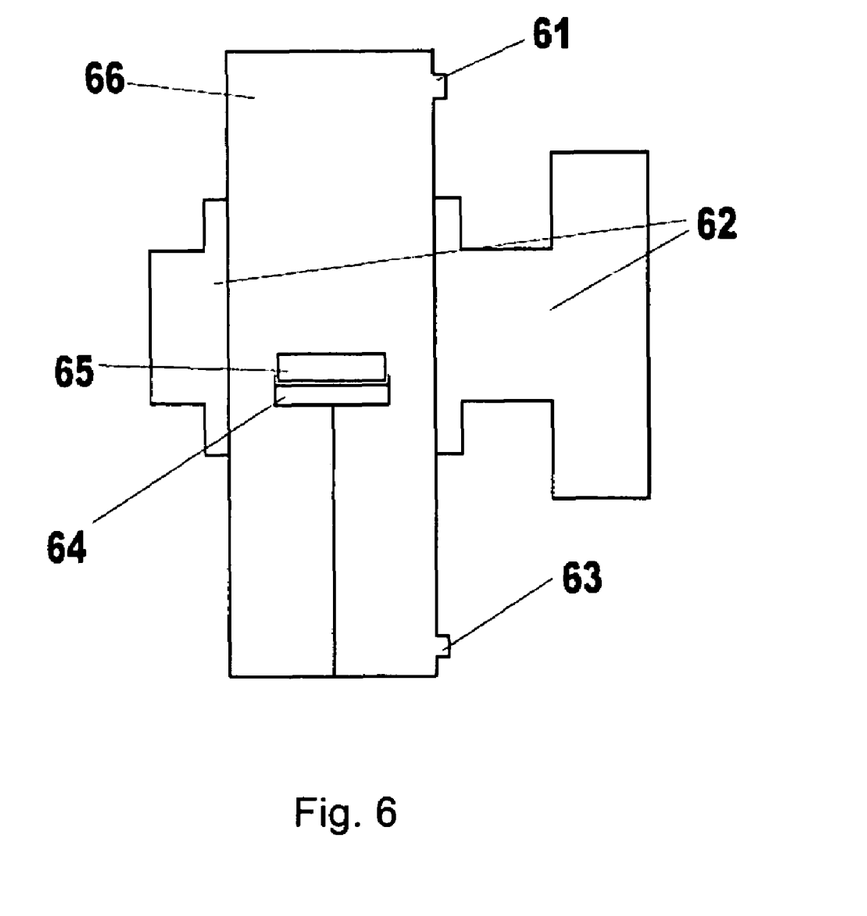
FIG. 6 is a schematic diagram illustrating microwave plasma enhanced chemical vapor deposition according to an embodiment of the present invention.

In addition, the heat conduction material having the bracket structure of carbon element can be formed on a metal surface by using CVD or PVD. Referring to FIG. 6, a schematic diagram illustrates microwave plasma enhanced chemical vapor deposition for manufacturing a heat dissipation structure according to an embodiment of the present invention. In the embodiment, the reaction procedure is that a mixed gas for desired reaction is delivered to a gas reaction room 66 from a gas inlet 61. At the same time, a microwave is generated by a microwave generation system 62 to activate the mixed gas in order to provide reactive ions for reacting. The reactive ions are absorbed to coat on a surface of a metal material 65 on a carrier 64 so as to form diamond films. The metal material 65 is the cap which is formed by the way described in FIG. 3, and the cap can be copper or aluminum or silver or other metals with high thermal conductivity or other material combinations. Remaining gas is discharged via a waste gas outlet 63. By the way mentioned above, a heat conduction material coating with diamond particles can be acquired.

Figure 7:
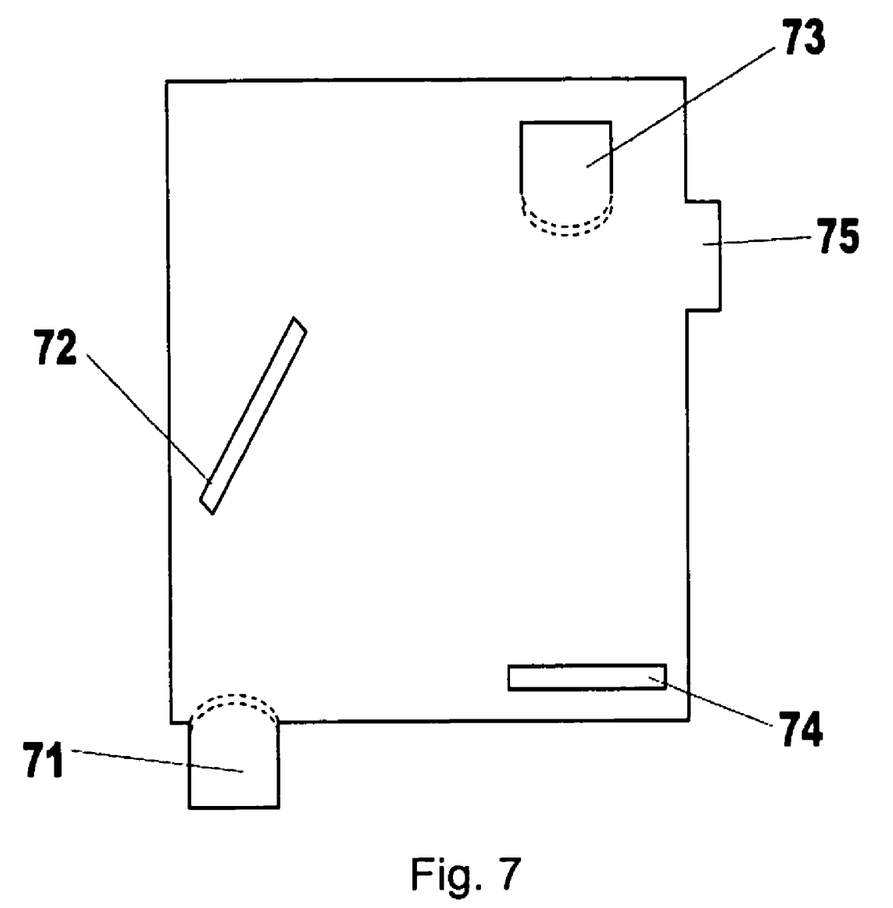
FIG. 7 is a schematic diagram illustrating ion beam sputtering according to an embodiment of the present invention.

Referring to FIG. 7, a schematic diagram illustrates ion beam sputtering for manufacturing a heat dissipation structure according to another embodiment of the present invention. In the embodiment, the manufacturing procedure is that a target 72 is molded by diamond materials first of all. The placement angle of the target 72 and the shooting direction of ion beam of a first ion gun 71 are approximately forty five degrees. The diamond particles shot by the first ion gun 71 fly to the front of a second ion gun 73. The diamond particles is then sputtered to the surface of a metal material 74 to form uniform diamond films by providing enough kinetic energy from the first ion gun 71. The metal material 74 is the cap which is formed by the way described in FIG. 3. The cap can be copper or aluminum or silver or other metals with high thermal conductivity or material combinations. The remaining diamond particles are discharged by a waste gas exit 75. By the way mentioned above, the cap coating with diamond particles or the heat conduction material can be acquired.

Moreover, the heat conduction material having a metal and a bracket structure of carbon element can be further made by electroplating, melting except CVD and PVD of the above embodiments.

Although the features and advantages of the embodiments according to the preferred invention are disclosed, it is not limited to the embodiments described above, but encompasses any and all modifications and changes within the spirit and scope of the following claims.

What is claimed is:

1. A chip heat dissipation structure for use in a die heat dissipation, said chip heat dissipation structure comprising: a bottom plate having an upper surface, said upper surface providing a bottom of said die heat dissipation for setting, and said bottom being electrically connected to said upper surface; and a cap having an upper plane and a lower plane, and four edges of said lower plane extending downward a side respectively, said lower plane and said side forming a space for placing said die heat dissipation and a hemline extended from said side pasting an edge of said upper surface of said bottom plate; wherein a heat contact layer is set between a top corresponding to said bottom of said die heat dissipation and said lower plane of said cap, said cap is combined a metal with a bracket structure of carbon element to form a heat conduction material.

2. The chip heat dissipation structure of claim 1, wherein said bottom plate is a material having a circuit structure for supporting said die heat dissipation, said material is an organic material.

3. The chip heat dissipation structure of claim 1, wherein said die heat dissipation is a central processor.

4. The chip heat dissipation structure of claim 1, wherein said heat contact layer is a heat interface material.

5. The chip heat dissipation structure of claim 4, wherein said heat interface material is thermal grease.

6. The chip heat dissipation structure of claim 4, wherein said heat interface material is a heat dissipation slip.

7. The chip heat dissipation structure of claim 4, wherein said heat interface material is an electrical insulating material with high thermal conductivity.

8. The chip heat dissipation structure of claim 1, wherein said metal is copper.

9. The chip heat dissipation structure of claim 1, wherein said metal is aluminum.

10. The chip heat dissipation structure of claim 1, wherein said metal is silver.

11. The chip heat dissipation structure of claim 1, wherein said metal is a metal material with high thermal conductivity.

12. The chip heat dissipation structure of claim 1, wherein said bracket structure of carbon element is diamonds.

13. The chip heat dissipation structure of claim 1, wherein said heat conduction material is made by chemical vapor deposition (CVD).

14. The chip heat dissipation structure of claim 1, wherein said heat conduction material is made by physical vapor deposition (PVD).

15. The chip heat dissipation structure of claim 1, wherein said heat conduction material is made by melting.

16. The chip heat dissipation structure of claim 1, wherein said heat conduction material is made by electroplating.

17. The chip heat dissipation structure of claim 1, wherein said heat contact layer is formed on a protruding of said top of said die heat dissipation for pasting said lower plane of said cap.

18. The chip heat dissipation structure of claim 1, wherein said heat contact layer is formed on said lower plane of said cap for pasting said top of said die heat dissipation.

\* \* \* \* \*